(12) United States Patent
Cheng

(10) Patent No.: US 12,720,939 B2
(45) Date of Patent: Aug. 25, 2026

(54) LED STRUCTURE AND PREPARING METHOD OF LED STRUCTURE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 746 days.

(21) Appl. No.: 18/185,700

(22) Filed: Mar. 17, 2023

(65) Prior Publication Data

US 2023/0299118 A1 Sep. 21, 2023

(30) Foreign Application Priority Data

Mar. 21, 2022 (CN) ......................... 202210278784.9

(51) Int. Cl.
*H10H 29/14* (2025.01)

(52) U.S. Cl.
CPC ................................... *H10H 29/14* (2025.01)

(58) Field of Classification Search
CPC combination set(s) only.
See application file for complete search history.

(56) References Cited

U.S. PATENT DOCUMENTS

2010/0001257 A1* 1/2010 Yu .......................... H10H 20/84 257/E33.014
2018/0342649 A1* 11/2018 Shur ...................... H10H 20/84
2019/0355878 A1* 11/2019 Ahmed .............. H10H 20/8512
2022/0231192 A1* 7/2022 Hurni .................. H10H 20/821

* cited by examiner

*Primary Examiner* — Chad M Dicke
*Assistant Examiner* — Priya M Rampersaud
(74) *Attorney, Agent, or Firm* — Westbridge IP LLC

(57) ABSTRACT

Disclosed are an LED structure and a preparing method of an LED structure. The LED structure includes: an LED light emitting unit including a first semiconductor layer, a light emitting layer and a second semiconductor layer which are stacked; and a first stress layer surrounding the LED light emitting unit and covering a side wall of the LED light emitting unit. In the present disclosure, the first stress layer is configured to apply a stress to the side wall of the LED light emitting unit, adjust a wavelength of the LED structure, and improve a wavelength uniformity of the LED structure. In addition, since a side wall of the LED structure is extruded, and a luminous efficiency of the LED structure is effectively improved.

17 Claims, 4 Drawing Sheets

LED STRUCTURE AND PREPARING METHOD OF LED STRUCTURE

CROSS-REFERENCE TO RELATED APPLICATIONS

The present application claims priority to Chinese Patent Application No. 202210278784.9, filed on Mar. 21, 2022, which is hereby incorporated by reference in its entirety.

TECHNICAL FIELD

The present disclosure relates to the field of semiconductor technologies, and in particular, to an LED structure and a preparing method of an LED structure.

BACKGROUND

In recent years, a Light Emitting Diode (LED) is used as a new generation of green light source, which is widely used in the fields of lighting, backlight, display, indication and so on. The light emitting diode includes an N-type semiconductor layer, a light emitting layer and a P-type semiconductor layer which are stacked. A group III nitride, represented by gallium nitride, is a wide bandgap semiconductor material with a direct bandgap, has excellent properties such as high electron drift saturation speed, good thermal conductivity, strong chemical bonds, high-temperature resistance and corrosion resistance, and is widely used in LED. An existing gallium nitride-based LED epitaxial wafer includes a sapphire substrate, and a buffer layer, an undoped GaN layer, an N-type GaN layer, a multi-quantum well layer and a P-type GaN layer which are sequentially stacked on the sapphire substrate. The multi-quantum well layer includes an InGaN quantum well layer and a GaN quantum barrier layer which are alternately stacked.

However, an LED structure is affected by the preparation environment due to multiple preparation processes, and wavelengths of the LED structures at different positions are not uniform, which greatly affects a light-emitting quality of the LED structure.

SUMMARY

Objectives of the present disclosure are to provide an LED structure and a preparing method of the LED structure, which improve a wavelength uniformity of the LED structure by adjusting a stress on a side wall of the LED structure.

According to an aspect of the present disclosure, embodiments of the present disclosure provide an LED structure, including:

- a substrate structure;
- at least one LED light emitting unit located on the substrate structure, the LED light emitting unit including a first semiconductor layer, a light emitting layer and a second semiconductor layer which are stacked; and
- a first stress layer surrounding the LED light emitting unit and covering a side wall of the LED light emitting unit, where the first stress layer is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit.

As an optional embodiment, the first stress layer is insulated from the LED light emitting unit.

As an optional embodiment, a material of the first stress layer includes one or more of SiN, SiO2 and diamond-like materials.

As an optional embodiment, the first stress layer has a trench, and the trench at least partially penetrates the first stress layer.

As an optional embodiment, thicknesses of the first stress layer at side walls of LED light emitting units located at different positions are the same or different.

As an optional embodiment, a material of the first stress layer is SiN or SiO2, and Si components in the first stress layer at side walls of LED light emitting units located at different positions are the same or different.

As an optional embodiment, the trench completely penetrates the first stress layer, a second stress layer is disposed in the trench, and the second stress layer is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit.

As an optional embodiment, a material of the second stress layer is a III-V group compound, and a lattice constant of the material of the second stress layer is greater than a lattice constant of a material in the LED light emitting unit.

As an optional embodiment, the material of the second stress layer is InGaN.

As an optional embodiment, the LED structure further includes:

- a first electrode electrically connected to the first semiconductor layer; and
- a second electrode electrically connected to the second semiconductor layer.

As an optional embodiment, a material of the second stress layer is a piezoelectric material; and the LED structure further includes:

- a third electrode, where the second stress layer is electrically connected to the third electrode.

According to an aspect of the present disclosure, embodiments of the present disclosure provide a preparing method of an LED structure, including:

- providing a substrate structure, and forming an LED light emitting unit on the substrate structure, the LED light emitting unit including a first semiconductor layer, a light emitting layer and a second semiconductor layer which are stacked; and
- forming a first stress layer surrounding the LED light emitting unit, where the first stress layer covers a side wall of the LED light emitting unit, and is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit.

As an optional embodiment, a material of the first stress layer includes one or more of SiN, SiO2 and diamond-like materials.

As an optional embodiment, the forming a first stress layer surrounding the LED light emitting unit includes:

- controlling components of the first stress layer located at different positions to be different, and/or, controlling formation temperatures of the first stress layer located at different positions to be different.

As an optional embodiment, the forming a first stress layer surrounding the LED light emitting unit includes: controlling, by local etching or local increase of thickness, thicknesses of the first stress layer located at different positions to be different.

As an optional embodiment, the preparing method of an LED structure further includes:

forming a trench in the first stress layer, the trench penetrating the first stress layer, and forming a second stress layer in the trench.

As an optional embodiment, a material of the second stress layer is a III-V group compound, and a lattice constant of the material of the second stress layer is greater than a lattice constant of a material in the LED light emitting unit.

As an optional embodiment, the material of the second stress layer is InGaN.

As an optional embodiment, the preparing method of an LED structure further includes:

preparing a first electrode and a second electrode, where the first electrode is electrically connected to the first semiconductor layer, and the second electrode is electrically connected to the second semiconductor layer.

As an optional embodiment, a material of the second stress layer is a piezoelectric material, and after forming the second stress layer in the trench, the preparing method of an LED structure further includes:

preparing a third electrode, where the third electrode is electrically connected to the second stress layer.

DETAILED DESCRIPTIONS OF THE EMBODIMENTS

Figure 1A:
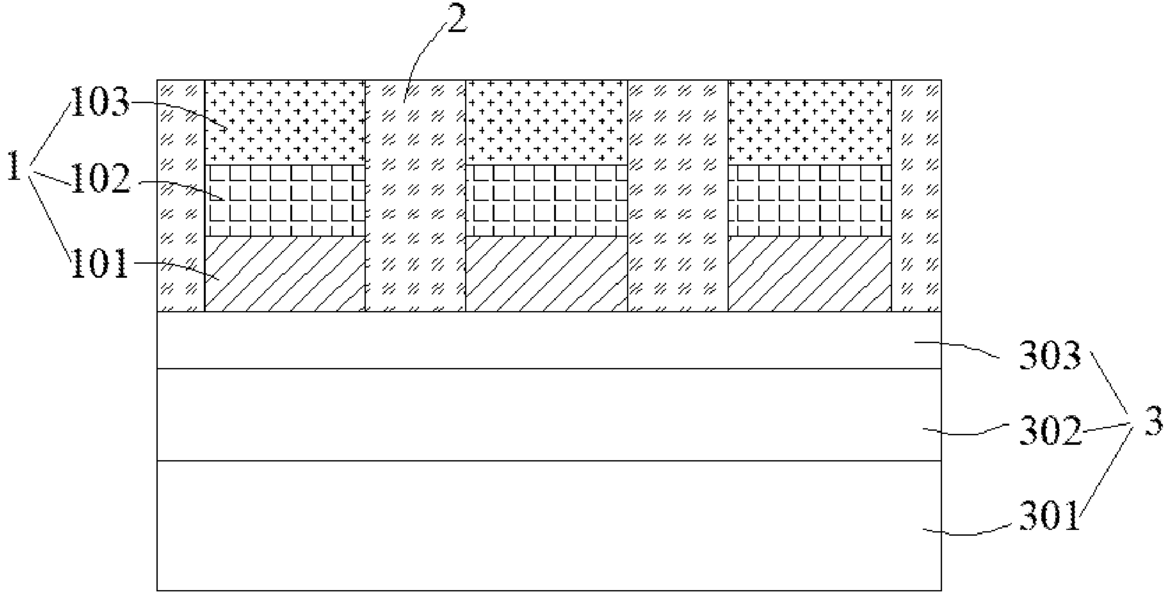
FIG. 1A is a schematic diagram of an LED structure according to Embodiment 1 of the present disclosure.

Exemplary embodiments are described in detail herein, examples of which are shown in accompanying drawings. When the following description refers to the accompanying drawings, the same numbers in different drawings represent the same or similar elements unless otherwise indicated. The embodiments described in the following exemplary embodiments do not represent all embodiments consistent with the present disclosure. On the contrary, they are only examples of devices that are consistent with some aspects of the present disclosure as detailed in the appended claims.

The terms used in the present disclosure are only intended to describe specific embodiments and are not intended to limit the present disclosure. Unless otherwise defined, technical terms or scientific terms used in the present disclosure should have ordinary meanings understood by those of ordinary skill in the art to which the present disclosure relates. The terms "first", "second" and similar terms used in the specification and the claims of the present disclosure do not signify any order, quantity or importance but are only used to distinguish different components. Similarly, the terms such as "one" or "a" do not denote a quantity limitation but mean that there are at least one. The terms "multiple" or "several" means two or more. Unless otherwise noted, the terms such as "front", "rear", "lower" and/or "upper" are only for ease of description, and are not limited to a position or a spatial orientation. The terms such as "include" or "comprise" are intended to indicate that an element or object before "include" or "comprise" encompasses elements or objects that appear to be listed after "include" or "comprise" and their equivalents, and other elements or objects are not excluded. The terms such as "connect" or "connected" are not limited to physical or mechanical connections and may include electrical connections, whether direct or indirect. The singular forms of "a" and "the" used in the specification and the appended claims are also intended to include the majority form unless the context clearly indicates other meanings. It should also be understood that the term "and/or" used in the specification refers to and includes any or all possible combinations of one or more associated listed items.

In related technologies, a light emitting diode includes an N-type semiconductor layer, a light emitting layer, and a P-type semiconductor layer which are stacked. However, an concentration and an mobility of electrons of the light emitting diode are far greater than those of holes, resulting in a large number of electrons not recombined with the holes in the light emitting layer. The electrons are easy to overflow into the P-type semiconductor layer and produce non-radiative recombination with holes in the P-type semiconductor layer, so that the number of holes injected into the light emitting layer is reduced, and a luminous efficiency and a luminous intensity of the light emitting diode are reduced.

Embodiment 1

Figure 1B:
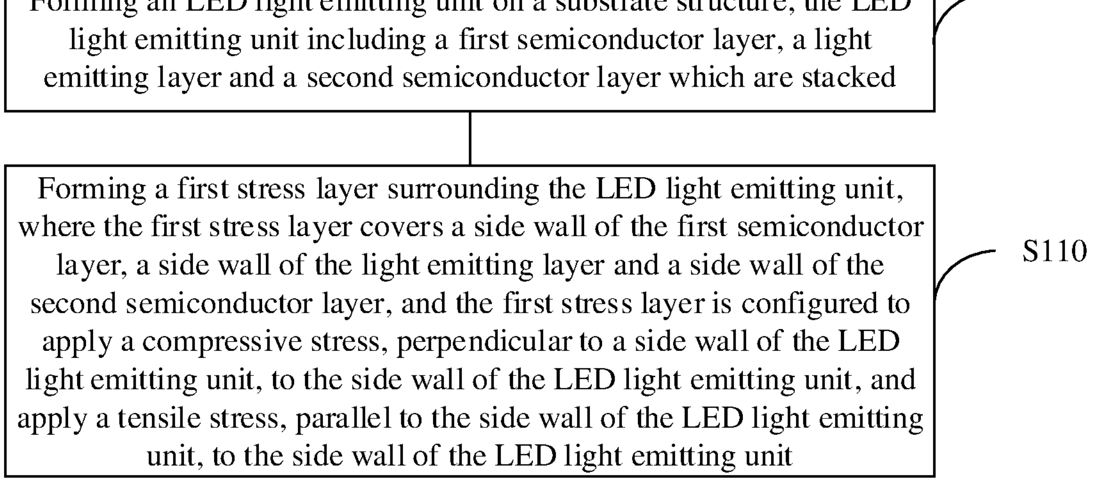
FIG. 1B is a schematic flowchart of a preparing method of an LED structure according to an embodiment of the present disclosure.

An LED structure and a preparing method of the LED structure are provided according to Embodiment 1 of the present disclosure. FIG. 1A is a schematic diagram of an LED structure according to Embodiment 1 of the present disclosure. FIG. 1B is a schematic flowchart of a preparing method of an LED structure according to an embodiment of the present disclosure. The preparing method of the LED structure may include steps S100 to step S110.

Step S100: forming an LED light emitting unit 1 on a substrate structure 3, the LED light emitting unit 1 including a first semiconductor layer 101, a light emitting layer 102 and a second semiconductor layer 103 which are stacked.

Step S110: forming a first stress layer 2 surrounding the LED light emitting unit 1, where the first stress layer 2 covers a side wall of the first semiconductor layer 101, a side wall of the light emitting layer 102 and a side wall of the second semiconductor layer 103, and the first stress layer 2 is configured to apply a compressive stress, perpendicular to a side wall of the LED light emitting unit 1, to the side wall of the LED light emitting unit 1, and apply a tensile stress, parallel to the side wall of the LED light emitting unit 1, to the side wall of the LED light emitting unit 1.

In the LED structure prepared in the embodiment, one of the first semiconductor layer 101 and the second semiconductor layer 103 is an N-type semiconductor layer, and the other is a P-type semiconductor layer. The side wall of the first semiconductor layer 101, the side wall of the light emitting layer 102 and the side wall of the second semiconductor layer 103 are covered by the first stress layer 2, and a material of the first stress layer 2 may be SiN, $SiO_2$, Diamond-Like Carbon (DLC) or the like. For example, the material of the first stress layer 2 is silicon nitride, by controlling more free nitrogen elements or silicon elements in a silicon nitride film, the silicon nitride film exhibits an intrinsic compressive stress, and a compressive stress, perpendicular to the side wall of the LED light emitting unit 1, and a tensile stress, parallel to the side wall of the LED light emitting unit 1, are applied to the side wall of the LED light emitting unit 1. This is because silicon nitride molecules near voids or defects in the silicon nitride film maintain the morphology of the silicon nitride film with attraction to each other, when a free nitrogen element or a free silicon element is filled into the voids in the silicon nitride film, an atom/molecule of a free nitrogen element or a free silicon element may generate an extrusion stress to the silicon nitride film around the voids, so that the silicon nitride film exhibits the intrinsic compressive stress. The silicon nitride film applies the compressive stress, perpendicular to the side wall of the LED light emitting unit 1, and the tensile stress, parallel to the side wall of the LED light emitting unit 1, to the side wall of the LED structure in contact with the silicon nitride film. The greater the stress, the longer a luminous wavelength of the LED structure. The wavelength of the LED structure is adjusted by applying a stress, thereby improving a wavelength uniformity of the LED structure.

In another aspect, the stress is applied to the side wall of the LED light emitting unit to improve a hole concentration of the P-type semiconductor layer, thereby increasing the number of holes injected into the light emitting layer 102, reducing the number of electrons not recombined with the holes in the light emitting layer 102, reducing the number of electrons overflowing from the light emitting layer 102 to the P-type semiconductor layer, reducing a non-radiative recombination, and improving a luminous efficiency and a luminous intensity. In another aspect, the light emitting layer 102 includes an InGaN material. In this embodiment, the luminous wavelength is adjusted by the stress, and an In content required for the LED light emitting unit 1 to emit light of the same wavelength is reduced, thereby reducing a lattice mismatch between the InGaN and other materials in the light emitting layer 102, and further improving the luminous efficiency. In another aspect, in the preparing process of the LED structure, the light emitting layers at different positions have a problem of non-uniform luminous wavelengths, and the wavelength of the light emitting layer may be adjusted by the setting of a stress layer structure in the present disclosure, thereby improving an uniformity of the luminous wavelength of the LED structure in the display device.

The steps of this embodiment are described in detail below:

In Step S100, the LED light emitting unit 1 is formed on the substrate structure 3, and the LED light emitting unit 1 includes the first semiconductor layer 101, the light emitting layer 102 and the second semiconductor layer 103 which are stacked.

The substrate structure 3 may include a substrate 301, a nucleation layer 302 and a buffer layer 303. The substrate 301 may be a silicon substrate 301, of course, may also be a silicon carbide substrate 301, but is not limited thereto, and may also be a sapphire substrate 301 or the like. The nucleation layer 302 may be disposed on a side of the silicon substrate 301. The buffer layer 303 may cover the nucleation layer 302. The LED light emitting unit 1 may be formed on a side, facing away from the substrate 301, of the buffer layer 303. Specifically, the first semiconductor layer 101 may be disposed on the side, facing away from the substrate 301, of the buffer layer 303. The light emitting layer 102 may be disposed a side, facing away from the substrate 301, of the first semiconductor layer 101. The light emitting layer 102 may be at least one of a single quantum well structure, a Multiple Quantum Well (MQW) structure, a quantum line structure and a quantum dot structure. The second semiconductor layer 103 may be disposed on a side, facing away from the substrate 301, of the light emitting layer 102. A conductivity type of the first semiconductor layer 101 is different from that of the second semiconductor layer 103. The first semiconductor layer 101 may be the P-type semiconductor layer, and the second semiconductor layer 103 may be the N-type semiconductor layer. Of course, the first semiconductor layer 101 may be the N-type semiconductor layer, and the second semiconductor layer 103 may be the P-type semiconductor layer. The N-type semiconductor layer and/or the P-type semiconductor layer may include a Group III nitride material. The Group III nitride material may be at least one of GaN, AlGaN, InGaN and AlInGaN. N-type ions in the N-type semiconductor layer may be at least one of Si ions, Ge ions, Sn ions, Se ions or Te ions. P-type doped ions in the P-type semiconductor layer may be at least one of Mg ions, Zn ions, Ca ions, Sr ions or Ba ions. In addition, the number of the LED light emitting unit 1 formed on the substrate structure 3 may be one or more.

For example, the formation process of the LED light emitting unit 1 may include: forming an LED structure layer on the substrate structure 3; and patterning the LED structure layer to form one or more LED light emitting unit 1. Of course, the present disclosure may also form the LED light emitting unit 1 by the following method: forming a mask layer on the substrate structure 3; patterning the mask layer to form one or more through holes exposing the substrate structure 3 on the mask layer; forming the LED light emitting unit 1 in the through holes; and removing the mask layer. The above "patterning" may include steps such as etching, where the mask layer may be the first stress layer 2 in the present disclosure.

In Step S110, the first stress layer 2 surrounding the LED light emitting unit 1 is formed, and the side wall of the first semiconductor layer 101, the side wall of the light emitting layer 102 and the side wall of the second semiconductor layer 103 are covered by the first stress layer 2.

The first stress layer 2 may be formed in a reaction chamber, and its formation process may include Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), or metal-organic compound chemical vapor deposition, or a combination thereof. The first stress layer 2 is insulated from the LED light emitting unit 1. A material of the first stress layer 2 may be an insulating material, such as SiN or Diamond-Like Carbon (DLC), so that the first stress layer 2 may apply a specific degree of compressive stress to the LED light emitting unit 1 in a direction perpendicular to the side wall of the LED light emitting unit 1, and may apply a specific degree of tensile stress to the LED light emitting unit 1 in a direction parallel to the side wall of the LED light emitting unit 1.

Of course, in the present disclosure, the first stress layer 2 may be formed on the substrate structure 3 first, the first stress layer 2 is provided with at least one opening to expose the substrate structure 3, and then the LED light emitting unit 1 is formed in the opening. The LED light emitting unit 1 includes the first semiconductor layer 101, the light emitting layer 102 and the second semiconductor layer 103 which are stacked.

The LED structure, according to Embodiment 1 of the present disclosure, may be prepared by the above preparing method of an LED structure. The LED structure may include the substrate structure 3, the LED light emitting unit 1 and the first stress layer 2. The LED light emitting unit 1 and the first stress layer 2 are both disposed on the substrate structure 3. The LED light emitting unit 1 may include the first semiconductor layer 101, the light emitting layer 102 and the second semiconductor layer 103 which are stacked. The first stress layer 2 may surround the LED light emitting unit 1 and cover the side wall of the first semiconductor layer 101, the side wall of the light emitting layer 102 and the side wall of the second semiconductor layer 103.

Embodiment 2

Figure 2:
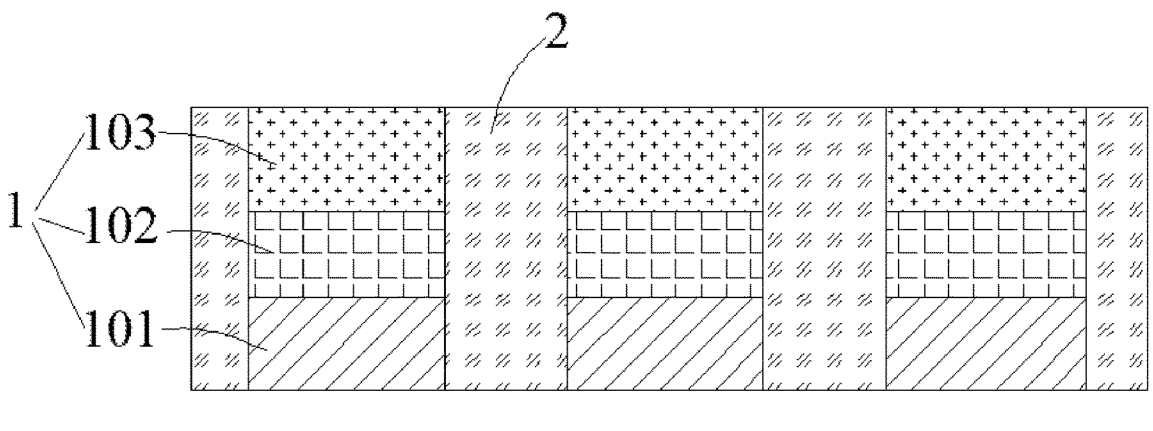
FIG. 2 is a schematic diagram of an LED structure according to Embodiment 2 of the present disclosure.

The LED structure and the preparing method of the LED structure in Embodiment 2 of the present disclosure are substantially the same as the LED structure and the preparing method of the LED structure in Embodiment 1 of the present disclosure, and the difference is that, as shown in FIG. 2, the substrate structure 3 is removed after the first stress layer 2 is formed.

Embodiment 3

Figure 3:
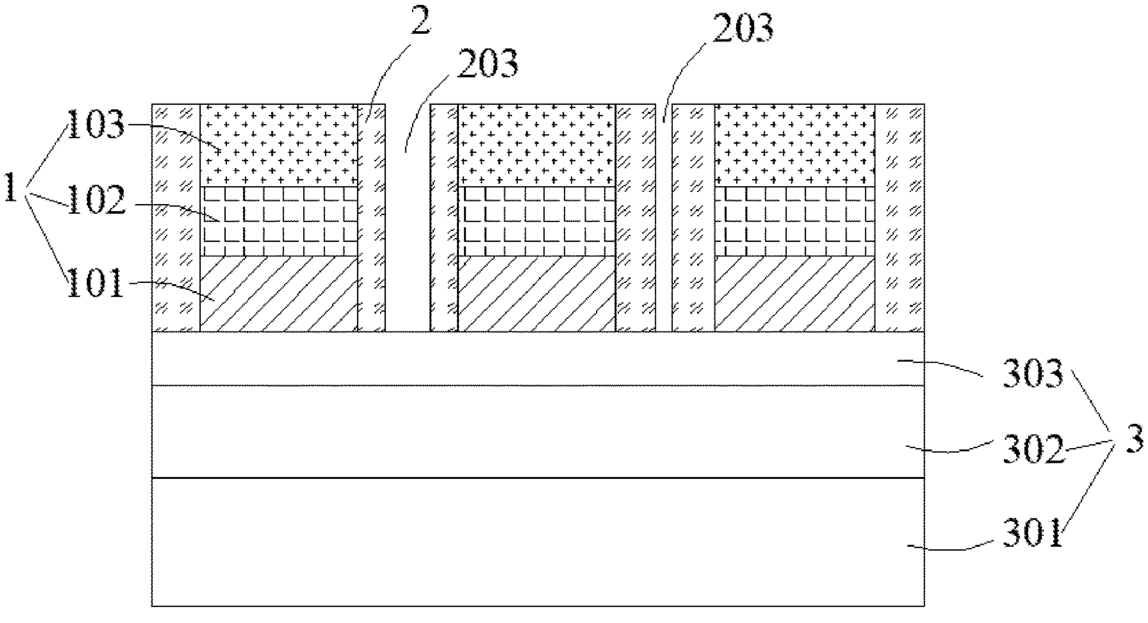
FIG. 3 is a schematic diagram of an LED structure according to Embodiment 3 of the present disclosure.

FIG. 3 is a schematic diagram of an LED structure according to Embodiment 3 of the present disclosure. The LED structure and the preparing method of the LED structure in Embodiment 3 of the present disclosure are substantially the same as the LED structure and the preparing method of the LED structure in Embodiment 1 or Embodiment 2 of the present disclosure, and the difference is that thicknesses of the first stress layer 2 at side walls of the LED light emitting units 1 located at different positions are different in this embodiment. The first stress layer 2 may be conformally formed on the side of the LED light emitting unit 1 and a surface exposed by the substrate structure 3 between adjacent LED light emitting units 1 by a coating method, and the thicknesses of the first stress layer 2 at the side walls of the LED light emitting units 1 located at different positions are different. Alternatively, the first stress layer 2 fills gaps between all the LED light emitting units 1 by a deposition method, or the first stress layer 2 is a mask for preparing the LED light emitting unit 1, a trench 203 is formed by etching the first stress layer 2, and the trench 203 at least partially penetrates the first stress layer 2. After the first stress layer 2, surrounding the LED light emitting unit 1, is formed, the thicknesses of the first stress layer 2 at the side walls of the LED light-emitting units 1 located at different positions may be controlled to be different by local etching or local increase of thickness. Further, widths of the trenches 203 located at different positions are controlled to be the same or different, so that the thicknesses of the first stress layer 2 located at different positions are the same or different, that is, the thicknesses of the first stress layer 2 at the side walls of the LED light emitting units 1 located at different positions are the same or different.

Figure 7:
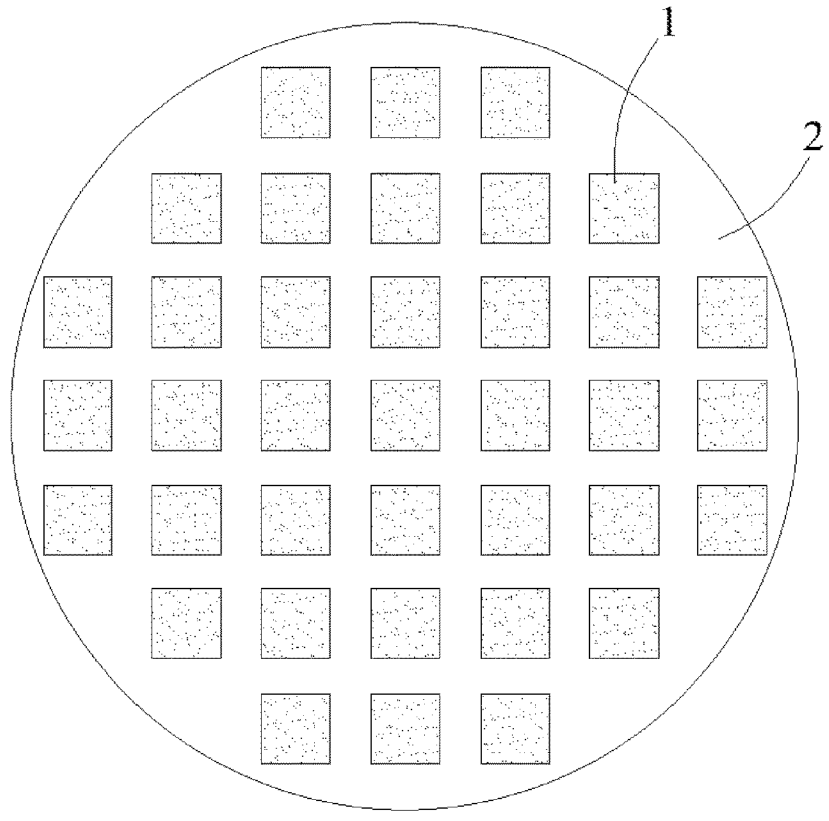
FIG. 7 is a schematic plan diagram of an LED structure according to an embodiment of the present disclosure.

FIG. 7 is a schematic plan diagram of an LED structure according to an embodiment of the present disclosure. As shown in FIG. 7, for example, the number of the LED light emitting unit 1 may be multiple, the multiple LED light emitting units 1 may be disposed at intervals and may be distributed in an array, but an arrangement of the LED light emitting units 1 is not specially limited in the present disclosure. In addition, an orthographic projection of the LED light emitting unit 1 on the substrate structure 3 may be any shape such as a square, a circle, a rectangle or a diamond.

The greater the thickness of the first stress layer 2, the greater the stress applied to the side wall of the LED light emitting unit 1. In the preparing process of the LED structure, the light emitting layers at different positions have a problem of non-uniform luminous wavelengths, and the present disclosure may adjust a wavelength of the LED light emitting unit 1 by controlling the thickness of the first stress layer 2, thereby improving a uniformity of the luminous wavelength of the LED structure in a display device, and further improving a luminous efficiency and a luminous intensity of the LED light emitting unit 1. At the same time, with reference to FIG. 7, since temperatures of growth environments of the LED light emitting units 1 located at different positions are different, for example, a temperature of an edge of the substrate structure 3 is higher than a temperature of a center of the substrate structure 3, which may cause the wavelengths of the LED light emitting units 1 not to be uniform. A thickness of the first stress layer 2 located at the edge of the substrate structure 3 may be controlled to be greater than that of the first stress layer 2 located at the center of the substrate structure 3, so that a stress, generated by the first stress layer 2 located at the edge of the substrate structure 3, on an adjacent LED light emitting unit 1 is larger, and thus the wavelengths of all the LED light emitting units 1 on the substrate structure 3 are relatively uniform, and the uniformity of the luminous wavelength of the LED structure in a display device is improved.

Further, in this embodiment, when a material of the first stress layer 2 is SiN or $SiO_2$, Si components in the first stress layer 2 at the side walls of the light emitting units 1 located at different positions are the same or different. The Si component in the first stress layer 2 located at the edge of the substrate structure 3 may be increased so as to further improve the stress, generated by the first stress layer 2 located at the edge of the substrate structure 3, on an adjacent LED light emitting unit 1. Preferably, when the material of the first stress layer 2 is SiN or $SiO_2$, different doses of Si ions may be injected into the first stress layer 2 located at different positions to change the composition, and stresses applied by the first stress layer 2 located at different positions to the adjacent LED light emitting units 1 are controlled to be different, thereby improving the uniformity of the luminous wavelength of the LED structure at different positions in a display device.

Similarly, formation temperatures of the first stress layer 2 located at different positions may also be different to control the stresses applied by the first stress layers 2 located at different positions to the adjacent LED light emitting units 1 to be different.

In the present disclosure, by controlling the thickness, the growth temperature and growth pressure of the first stress layer 2, the wavelength of the LED light emitting unit 1 may be adjusted and the uniformity of the luminous wavelength of the LED structure at different positions in a display device may be improved.

Embodiment 4

Figure 4:
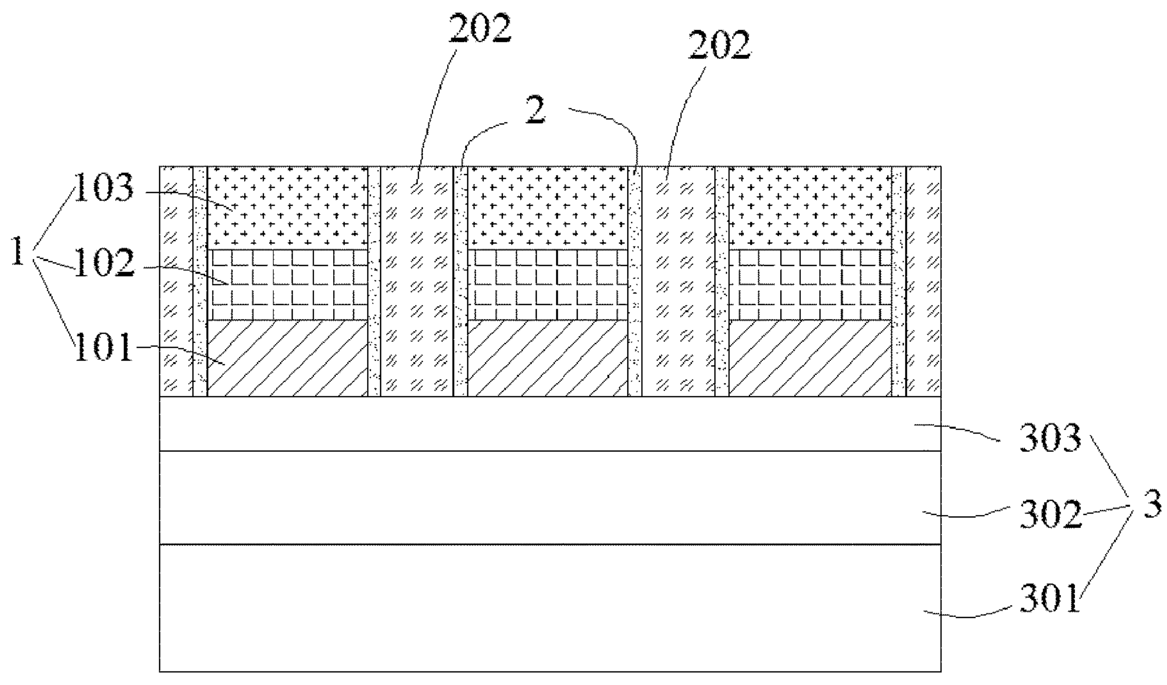
FIG. 4 is a schematic diagram of an LED structure according to Embodiment 4 of the present disclosure.

FIG. 4 is a schematic diagram of an LED structure according to Embodiment 4 of the present disclosure. The LED structure and the preparing method of the LED structure in Embodiment 4 of the present disclosure are substantially the same as the LED structure and the preparing method of the LED structure in any Embodiment of Embodiment 1 to Embodiment 3 of the present disclosure, and the difference is that the LED structure in this embodiment further includes a trench forming in the first stress layer 2, the trench completely penetrating the first stress layer 2, and a second stress layer 202 forming in the trench.

A material of the second stress layer 202 may be a III-V group compound having a lattice constant greater than a lattice constant of a material in an LED light emitting unit 1, such as InGaN, so that the second stress layer 202 may apply a compressive stress, perpendicular to a side wall of an LED light emitting unit 1, to the LED light emitting unit 1, and apply a specific degree of tensile stress to the LED light emitting unit 1 in a direction parallel to the side wall of the LED light emitting unit 1. The light emitting layer 102 of this embodiment includes an InGaN material, and the compressive stress reduces an In content required when the light emitting layer 102 of the LED light emitting unit 1 emits light of the same wavelength, thereby reducing a lattice mismatch between InGaN and other materials in the light emitting layer 102, and further improving a luminous efficiency.

Further, In element components of the second stress layer 202 located at different positions may be the same or different. Since temperatures of growth environments of the LED light emitting units 1 located at different positions are different, for example, a temperature of an edge of the substrate structure 3 is higher than a temperature of a center of the substrate structure 3, the In element component of the second stress layer 202 located at the edge of the substrate structure 3 may be controlled to be large, so that a stress, generated by the second stress layer 202 located at the edge of the substrate structure 3, on an adjacent LED light emitting unit 1 is large. Therefore, wavelengths of all the LED light emitting units 1 on the substrate structure 3 are uniform, and an uniformity of the luminous wavelengths of the LED light emitting units located at different positions is improved.

In this embodiment, before the second stress layer 202 is formed, a mask layer (not shown in the figure) needs to be prepared on an upper surface of the LED light emitting unit 1, and a mask material is, for example, a dielectric layer such as $SiO_2$, so as to prevent a III-V group compound material from covering the upper surface of the LED light emitting unit 1 when the III-V group compound material such as InGaN is formed in step S110. The mask layer may be removed after the second stress layer 202 is formed.

Embodiment 5

Figure 5:
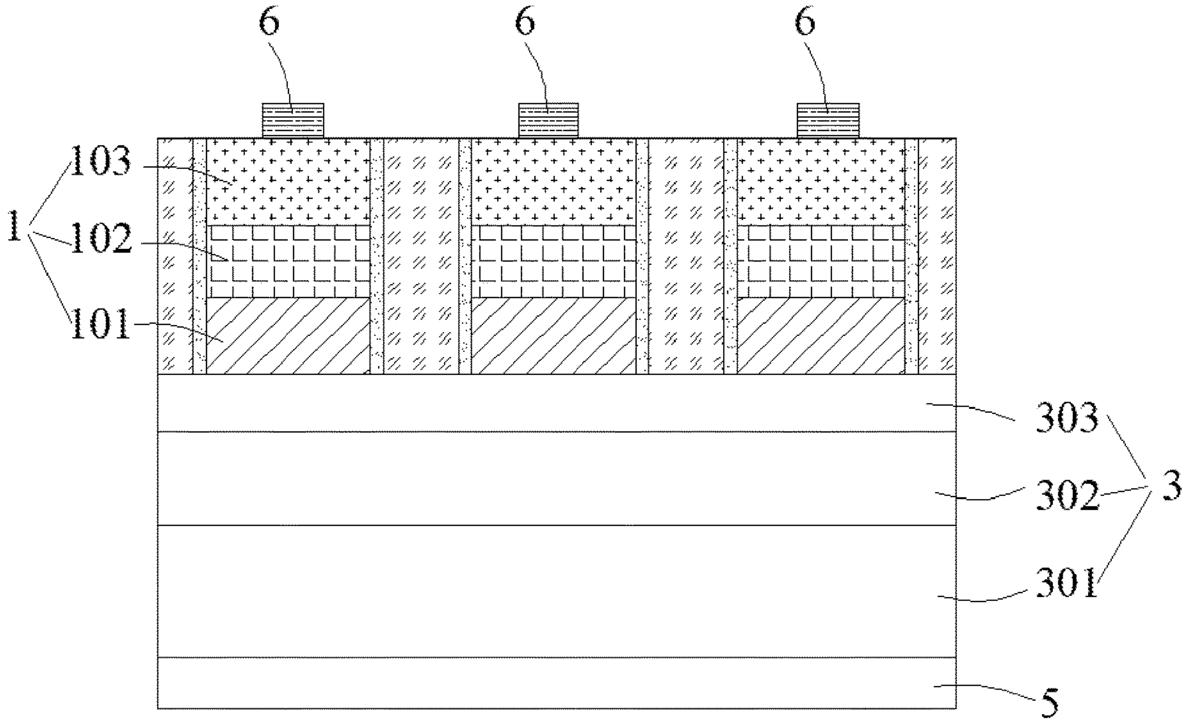
FIG. 5 is a schematic diagram of an LED structure according to Embodiment 5 of the present disclosure.

FIG. 5 is a schematic diagram of an LED structure according to Embodiment 5 of the present disclosure. The LED structure and the preparing method of the LED structure in Embodiment 5 of the present disclosure are substantially the same as the LED structure and the preparing method of the LED structure in any Embodiment of Embodiment 1 to Embodiment 4 of the present disclosure, and the difference is that, in this embodiment, a first electrode 5 electrically connected to the first semiconductor layer 101 is formed, and a second electrode 6 electrically connected to the second semiconductor layer 103 is formed. The first electrode 5 and the second electrode 6 may be located at two sides of an LED light emitting unit 1. Specifically, the first electrode 5 may be disposed on a side, facing away from the LED light emitting unit 1, of a substrate structure 3, and the second electrode 6 may be disposed on a side, facing away from a light emitting layer 102, of the second semiconductor layer 103. Taking the first semiconductor layer 101 as an N-type semiconductor layer and the second semiconductor layer 103 as a P-type semiconductor layer as an example, the first electrode 5 is an N-type electrode, and the second electrode 6 is a P-type electrode. A material of the first electrode 5 and a material of the second electrode 6 may be selected from at least one of gold, silver, aluminum, chromium, nickel, platinum, and titanium.

Embodiment 6

Figure 6:
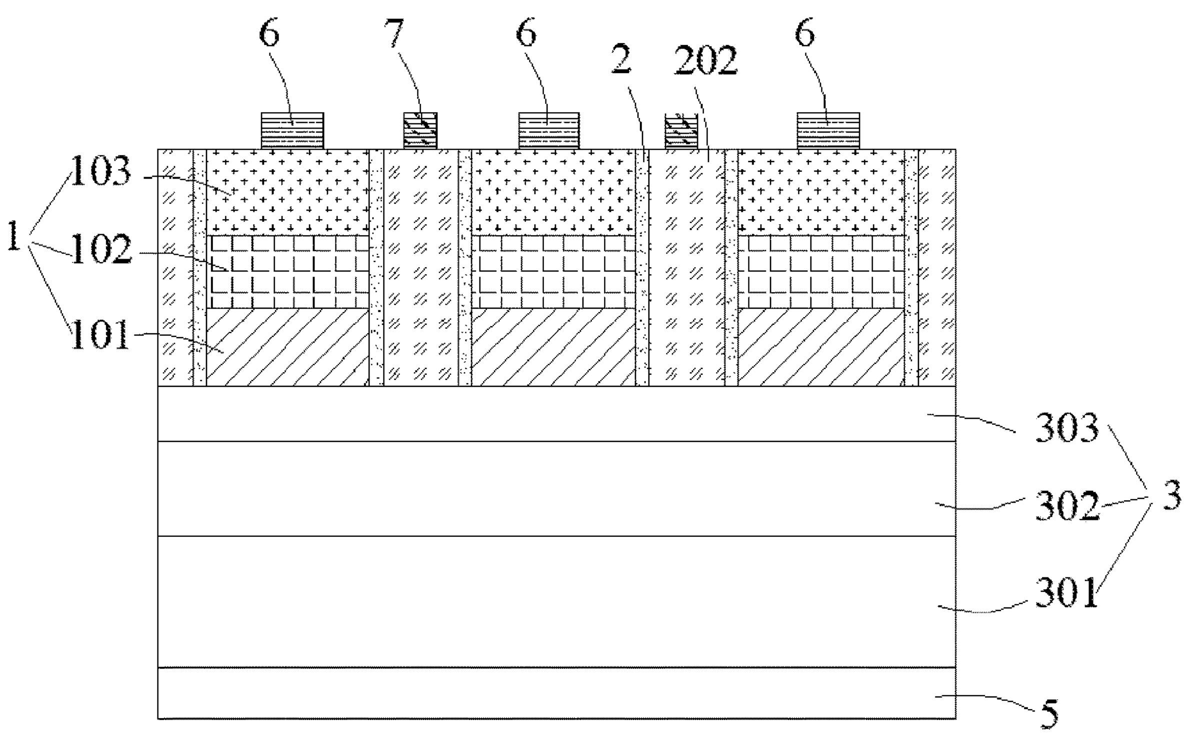
FIG. 6 is a schematic diagram of an LED structure according to Embodiment 6 of the present disclosure.

FIG. 6 is a schematic diagram of an LED structure according to Embodiment 6 of the present disclosure. The LED structure and the preparing method of the LED structure in Embodiment 6 of the present disclosure are substantially the same as the LED structure and the preparing method of the LED structure in Embodiment 5 of the present disclosure, and the difference is that, in this embodiment, a material of a second stress layer 202 is a piezoelectric material, a third electrode 7 is further formed, and the third electrode 7 is electrically connected to the second stress layer 202. A material of the third electrode 7 may be selected from at least one of gold, silver, aluminum, chromium, nickel, platinum, and titanium. Since the second stress layer 202 is the piezoelectric material, a voltage may be applied to the second stress layer 202 through the third electrode 7, and at this time, the second stress layer 202 may expand as the piezoelectric material, so that a stress applied to a side wall of an LED light emitting unit 1 by the second stress layer 202 may be further increased.

According to the LED structure and the preparing method of the LED structure of the present disclosure, the LED light emitting unit includes a first semiconductor layer, a light emitting layer and a second semiconductor layer which are stacked. The first stress layer surrounds the LED light emitting unit and covers a side wall of the LED light emitting unit. Due to the difference of parameters such as intrinsic compressive stress, thermal expansion coefficient or lattice constant of materials, so that the first stress layer applies a tensile stress parallel to a contact surface and a compressive stress perpendicular to the contact surface to a side wall of the first semiconductor layer, a side wall of the light emitting layer, and a side wall of the second semiconductor layer. In the present disclosure, by adjusting a thickness of the first stress layer, a growth temperature and/or components of the first stress layer, the tensile stress parallel to the contact surface and the compressive stress perpendicular to the contact surface applied by the first stress layer to the side wall of the LED structure in contact with the first stress layer are controlled. The larger the stress is, a luminous wavelength of the LED structure becomes longer. A wavelength of the LED structure is adjusted by applying the stress, thereby improving a wavelength uniformity of the LED structure.

In another aspect, a hole concentration in the P-type semiconductor layer of the LED structure is improved by applying a stress to a side wall of the LED, thereby increasing the number of holes injected into the light emitting layer, reducing the number of electrons not recombined with the holes in the light emitting layer, reducing the number of electrons overflowing from the light emitting layer to the P-type semiconductor layer, reducing a non-radiative recombination, and improving a luminous efficiency and a luminous intensity. In another aspect, the light emitting layer includes an InGaN material, an adjustment of the luminous wavelength is achieved by the stress, and at the same time, an In content required for the LED light emitting unit to emit light of the same wavelength is reduced, thereby reducing a lattice mismatch between the InGaN and other materials in the light emitting layer, and further improving the luminous efficiency.

The above are merely preferred embodiments of the present disclosure, and are not intended to limit the present disclosure in any form. Although the present disclosure has been disclosed in the preferred embodiments, they are not intended to limit the present disclosure, and any person skilled in the art, without departing from the scope of technical solutions of the present disclosure, may make some changes or modifications to equivalent embodiments with equivalent changes using the above described technical contents. Without departing from the content of the technical solutions of the present disclosure, any simple modification, equivalent change and modification of the above embodiments according to the technical essence of the present disclosure shall be included within the protection scope of the present disclosure.

What is claimed is:

1. A Light Emitting Diode (LED) structure, comprising:

a substrate structure;

at least one LED light emitting unit located on the substrate structure, the LED light emitting unit comprising a first semiconductor layer, a light emitting layer and a second semiconductor layer which are stacked; and a first stress layer surrounding the LED light emitting unit and covering a side wall of the LED light emitting unit, wherein the first stress layer is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit, wherein a material of the first stress layer is SiN or $SiO_2$, and Si components in the first stress laver at side walls of LED light emitting units located at different positions are different.

2. The LED structure according to claim 1, wherein the first stress layer is insulated from the LED light emitting unit.

3. The LED structure according to claim 1, wherein the first stress layer has a trench, and the trench at least partially penetrates the first stress layer.

4. The LED structure according to claim 1, wherein thicknesses of the first stress layer at side walls of LED light emitting units located at different positions are different.

5. The LED structure according to claim 3, wherein the trench completely penetrates the first stress layer, a second stress layer is disposed in the trench, and the second stress layer is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit.

6. The LED structure according to claim 5, wherein a material of the second stress layer is a III-V group compound, and a lattice constant of the material of the second stress layer is greater than a lattice constant of a material in the LED light emitting unit.

7. The LED structure according to claim 6, wherein the material of the second stress layer is InGaN.

8. The LED structure according to claim 1, wherein the LED structure further comprises:

a first electrode electrically connected to the first semiconductor layer; and a second electrode electrically connected to the second semiconductor layer.

9. The LED structure according to claim 5, wherein a material of the second stress layer is a piezoelectric material; and the LED structure further comprises:

a third electrode, wherein the second stress layer is electrically connected to the third electrode.

10. A preparing method of an LED structure, comprising:

forming an LED light emitting unit on a substrate structure, the LED light emitting unit comprising a first semiconductor layer, a light emitting layer and a second semiconductor layer which are stacked; and forming a first stress layer surrounding the LED light emitting unit, wherein the first stress layer covers a side wall of the LED light emitting unit, and is configured to apply a compressive stress to the side wall of the LED light emitting unit in a direction perpendicular to the side wall of the LED light emitting unit, and apply a tensile stress to the side wall of the LED light emitting unit in a direction parallel to the side wall of the LED light emitting unit, wherein a material of the first stress layer is SiN or $SiO_2$, and Si components in the first stress layer at side walls of LED light emitting units located at different positions are different.

11. The preparing method of an LED structure according to claim 10, wherein the forming a first stress layer surrounding the LED light emitting unit comprises:

controlling components of the first stress layer located at different positions to be different, and/or, controlling formation temperatures of the first stress layer located at different positions to be different.

12. The preparing method of an LED structure according to claim 10, wherein the forming a first stress layer surrounding the LED light emitting unit comprises:

controlling, by local etching or local increase of thickness, thicknesses of the first stress layer located at different positions to be different.

13. The preparing method of an LED structure according to claim 10, further comprising:

forming a trench in the first stress layer, the trench penetrating the first stress layer, and forming a second stress layer in the trench.

14. The preparing method of an LED structure according to claim 13, wherein a material of the second stress layer is a III-V group compound, and a lattice constant of the material of the second stress layer is greater than a lattice constant of a material in the LED light emitting unit.

15. The preparing method of an LED structure according to claim 14, wherein the material of the second stress layer is InGaN.

16. The preparing method of an LED structure according to claim 10, wherein the preparing method of an LED structure further comprises:

preparing a first electrode and a second electrode, wherein the first electrode is electrically connected to the first semiconductor layer, and the second electrode is electrically connected to the second semiconductor layer.

17. The preparing method of an LED structure according to claim 13, wherein a material of the second stress layer is a piezoelectric material, and after forming the second stress layer in the trench, the preparing method of an LED structure further comprises:

preparing a third electrode, wherein the third electrode is electrically connected to the second stress layer.

* * * * *